US 6,724,684 B2

(12) United States Patent  
Kim

(10) Patent No.: US 6,724,684 B2
(45) Date of Patent: Apr. 20, 2004

(54) APPARATUS FOR PIPE LATCH CONTROL CIRCUIT IN SYNCHRONOUS MEMORY DEVICE

(75) Inventor: Kwan-Weon Kim, Ichon (KR)

(73) Assignee: Hynix Semiconductor Inc., Ichon (KR)

( * ) Notice: Subject to any disclaimer, the term of this patent is extended or adjusted under 35 U.S.C. 154(b) by 0 days.

(21) Appl. No.: 10/261,042

(22) Filed: Oct. 1, 2002

(65) Prior Publication Data

US 2003/0117883 A1 Jun. 26, 2003

(30) Foreign Application Priority Data

Dec. 24, 2001 (KR) ........................................ 2001-84144

(51) Int. Cl.⁷ ............................... G11C 8/00; G11C 7/00
(52) U.S. Cl. .............. 365/233; 365/189.05; 365/230.08
(58) Field of Search ........................... 365/233, 189.08, 365/189.05, 230.06, 230.08, 236

(56) References Cited

U.S. PATENT DOCUMENTS

| 5,251,181 | A | | 10/1993 | Toda |
| 5,293,347 | A | | 3/1994 | Ogawa |
| 5,608,674 | A | | 3/1997 | Yabe et al. |
| 5,713,005 | A | * | 1/1998 | Proebsting ................... 713/600 |
| 6,044,023 | A | * | 3/2000 | Proebsting ............. 365/189.01 |
| 6,084,802 | A | * | 7/2000 | Shinozaki ............... 365/189.05 |
| 6,088,290 | A | * | 7/2000 | Ohtake et al. .............. 365/233 |
| 6,088,291 | A | | 7/2000 | Fujioka et al. |
| 6,101,609 | A | | 8/2000 | Kawasaka |

FOREIGN PATENT DOCUMENTS

| JP | 09-091955 | 4/1997 | ......... G11C/11/401 |
| JP | 10-040696 | 2/1998 | ........... G11C/29/00 |
| JP | 10-241359 | 9/1998 | ......... G11C/11/407 |
| JP | 10-247394 | 9/1998 | ........... G11C/19/28 |
| JP | 10-302471 | 11/1998 | ......... G11C/11/409 |
| JP | 11-176199 | 7/1999 | ........... G11C/29/00 |
| JP | 11-345489 | 12/1999 | ........... G11C/11/41 |
| JP | 2000-030465 | 1/2000 | ......... G11C/11/413 |
| JP | 2000-137982 | 5/2000 | ......... G11C/11/407 |

* cited by examiner

Primary Examiner—Thong Q. Le
(74) Attorney, Agent, or Firm—Jacobson Holman PLLC

(57) ABSTRACT

An apparatus for a pipe latch control circuit controlled by a pipe output control signal in a synchronous memory device. The apparatus includes a plurality of counting stages for counting in sequence in response to a data output buffer drive signal and a counting signal driver for generating the pipe output control signal by driving each counting signal, which is outputted from the plurality of counting stages and controlled by the data output buffer drive signal.

16 Claims, 5 Drawing Sheets

APPARATUS FOR PIPE LATCH CONTROL CIRCUIT IN SYNCHRONOUS MEMORY DEVICE

FIELD OF THE INVENTION

The present invention relates to an apparatus for pipe latch control circuit in a synchronous memory device.

DESCRIPTION OF THE PRIOR ART

The most prominent issue of the semiconductor memory field is a synchronous memory device such as SDRAM, DDR, double data rate SDRAM and RAMBUS DRAM. Synchronous memory is advantageous in that the operation is fast compared to general memory devices.

In synchronous memory devices such as the DDR SDRAM, a pipeline method is applied to most of the data buses. FIG. 1 is a block diagram of a synchronous memory data path utilizing an ordinary pipeline method in accordance with the prior art.

In FIG. 1, the synchronous memory data path includes: four pipe latches 14A through 14D, a first switch 12 for selectively passing output data, which is applied from a global data bus gio to one of the pipe latches by pipe input control signals pinz<0:3>, a data output buffer 18 for outputting the data to a data output terminal DQ using a data output buffer drive signal clk_do and a second switch 16 for selectively passing each output of the pipe latches 14A through 14D to the data output buffer 18 by pipe output control signals poutz<0:3>.

Furthermore, in the above synchronous memory data path, the pipe output control signals poutz<0:3> are provided for controlling the output of the pipe latches 14A through 14D and they come from a pipe latch control circuit 10, which inputs an output enable signal outen and a DLL clock signal clk_dll.

Meanwhile, the pipe latch 14A is divided into an even path and an odd path in the DDR SDRAM, because the global data bus gio is divided into an even data bus and an odd data bus. Furthermore, the pipe latch control circuit 10 is classified into even and odd parts.

FIG. 2 is a circuit diagram of the pipe latch control circuit in accordance with the prior art.

In FIG. 2, the pipe latch control circuit is reset by a reset signal rstdoutz and starts counting when an increment signal outeninc is received.

However, the pipe latch control circuit includes an initial counting controller 20 for generating an initial counting signal. The rest of the units form four stage counters. Each counting stage includes a transfer gate controlled by the increment signal, an inverter latch and an ordinary counter.

FIG. 3 is a timing chart of the pipe latch control circuit shown in FIG. 2 in accordance with the prior art. In FIG. 3, let the burst length BL be 4 when using the SDRAM and the burst length BL be 8 when using the DDR SDRAM.

In the pipe latch control circuit in accordance with the prior art, the increment signal outeninc is generated by performing a NAND operation on the output enable signal outen and the DLL clock signal clk_dll. That is, the increment signal outeninc is generated by receiving the DLL clock signal clk_dll during the active cycle of the output enable signal outen. The output enable signal outen forms a window as much as the burst length for the data outputting the data.

The increment signal outeninc controls the transfer gate in order to output count signals k<0:3> through the latch. The count signals k<0:3> pass through three inverters to generate the pipe output control signals poutz<0:3>. That is, the pipe output control signals poutz<0:3> are enabled by synchronizing with a falling edge of the increment signal outeninc.

However, the DLL clock signal clk_dll passes through eight gates before the pipe control signals poutz<0:3> appear as in FIG. 2. Actually, the data output buffer drive signal clk_do for controlling the data output from a DQ pin is a delayed signal compared with the DLL clock signal clk_dll. Therefore, the data output buffer drive signal clk_do is enabled so that the data is outputted from the data output buffer within the enabling period of the pipe output control signals poutz<0:3> under normal conditions. However, the data output buffer drive signal clk_do receives the DLL clock signal clk_dll during the activation of the output enable signal outen.

However, the operation timing of all semiconductor circuits is greatly changed according to whether an operation condition is the best condition or the worst condition. In the prior art as mentioned above, after the DLL clock signal clk_dll is disabled, since the pipe output output control signal poutz<0:3> is generated by passing through 8 gates, a long delay time is caused. Specifically, a considerable difference of the delay time between the best condition and the worst condition can occur. Accordingly, in case of the worst condition, the corresponding data from the data output buffer may not be outputted completely within the enabling period of the pipe output control signals poutz<0:3>. Therefore, the memory access time TAA should be limited for the complete data output. As an operation frequency increase, a loss of the memory access time TAA can be a serious problem.

SUMMARY OF THE INVENTION

It is, therefore, an object of the present invention to provide an apparatus for a pipe latch control circuit in a synchronous memory device.

In accordance with an aspect of the present invention, there is provided an apparatus for a pipe latch control circuit controlled by a pipe output control signal in a synchronous memory device, comprising: a plurality of counting stages for counting in sequence in response to a data output buffer drive signal; and a counting signal drive means for generating the pipe output control signal by driving each counting signal, which is outputted from the plurality of counting stages and controlled by the data output buffer drive signal.

BRIEF DESCRIPTION OF THE DRAWINGS

The above and other objects and features of the present invention will become apparent from the following description of the preferred embodiments taken in conjunction with the accompanying drawings, in which.

DETAILED DESCRIPTION OF THE PREFERRED EMBODIMENTS

Hereinafter, an apparatus for a pipe latch control circuit in a synchronous memory device according to the present invention will be described in detail with reference to the accompanying drawings.

Figure 4:
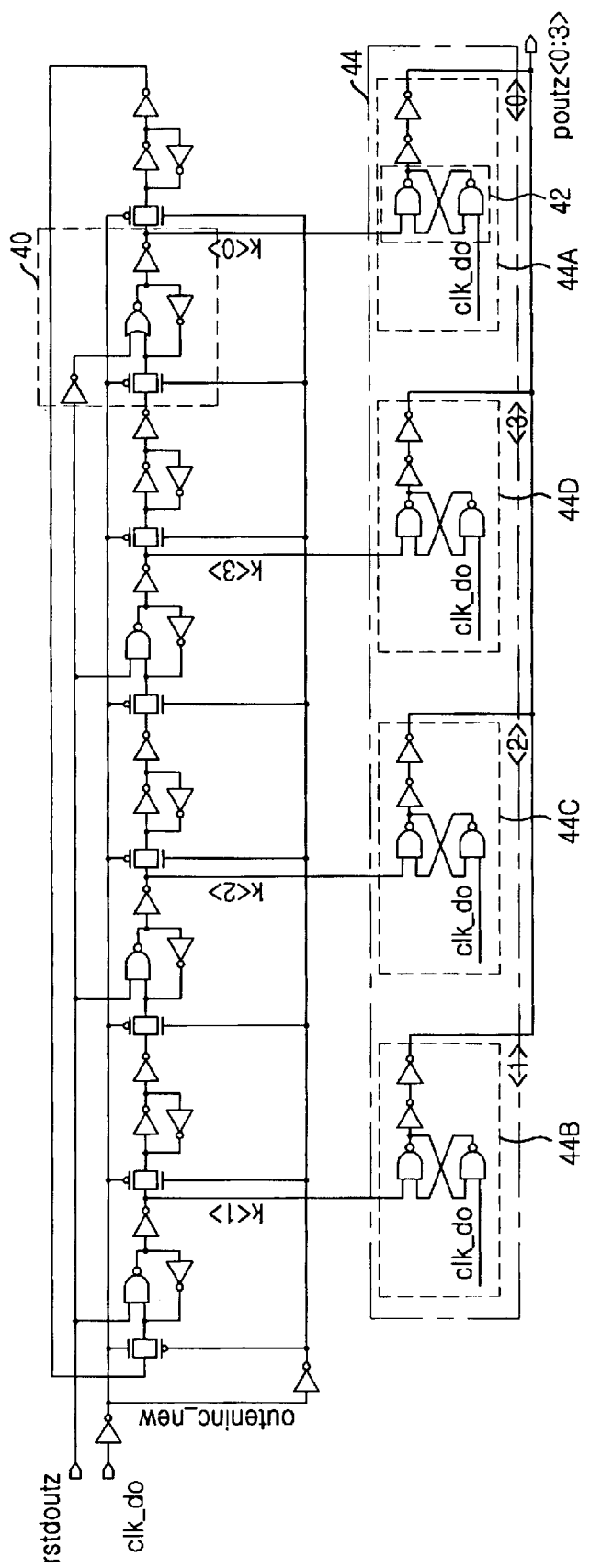
FIG. 4 is a pipe latch control circuit diagram of a synchronous memory device in accordance with the present invention.

FIG. 4 is a pipe latch control circuit diagram of the synchronous memory device in accordance with the present invention.

In FIG. 4, the pipe latch control circuit includes an initial counting signal generator 40 for generating an initial counting signal and a NAND latch unit 44 having a plurality of counting stages for generating pipe control signals poutz<0:3> by driving counting signals k<0:3>.

Figure 1:
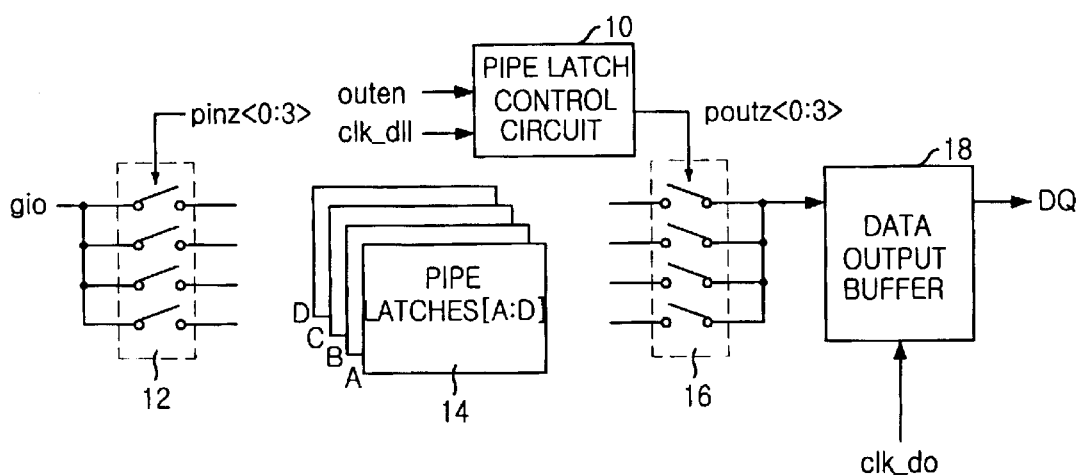
FIG. 1 is a block diagram of a synchronous memory data path utilizing an ordinary pipeline method in accordance with the prior art.
Figure 2:
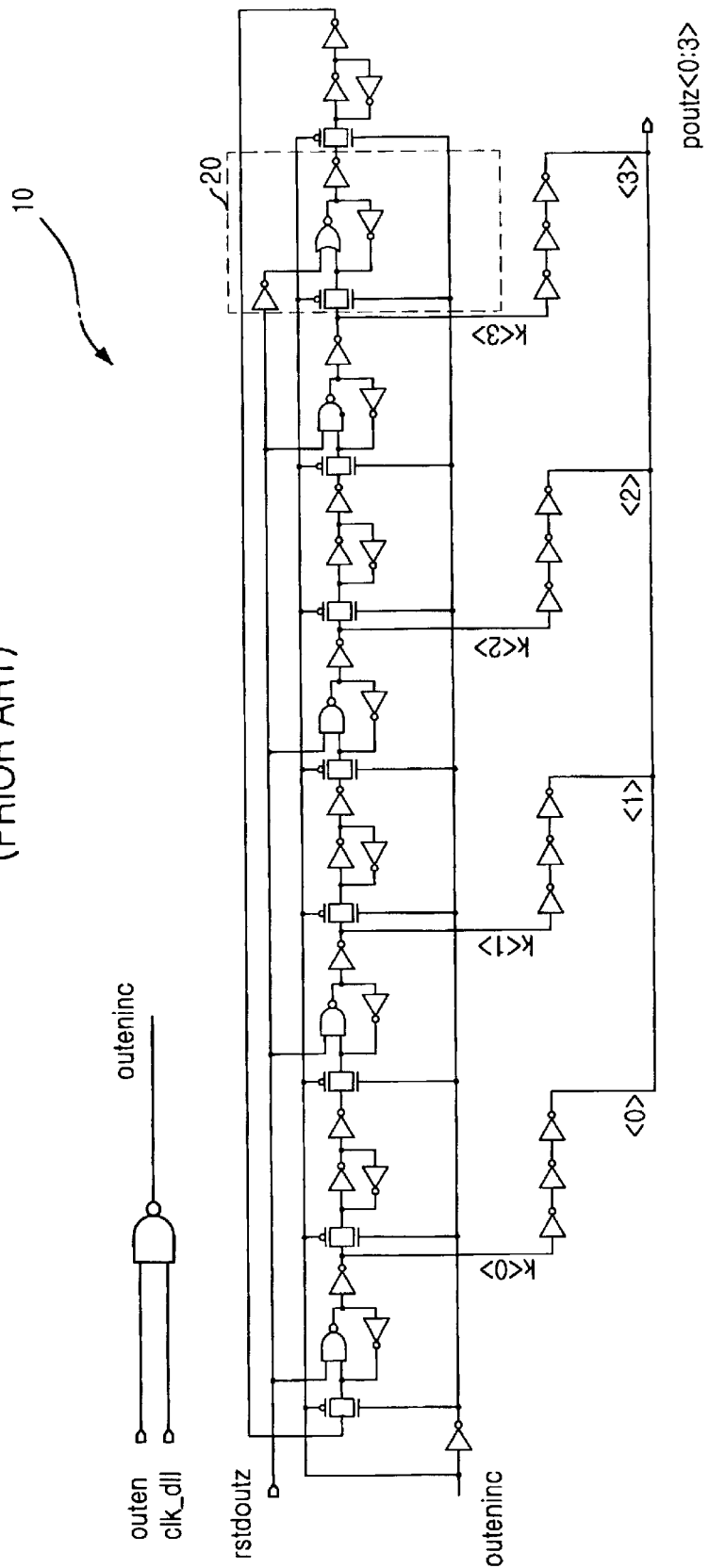
FIG. 2 is a circuit diagram of a pipe latch control circuit shown in FIG. 1 in accordance with the prior art.
Figure 3:
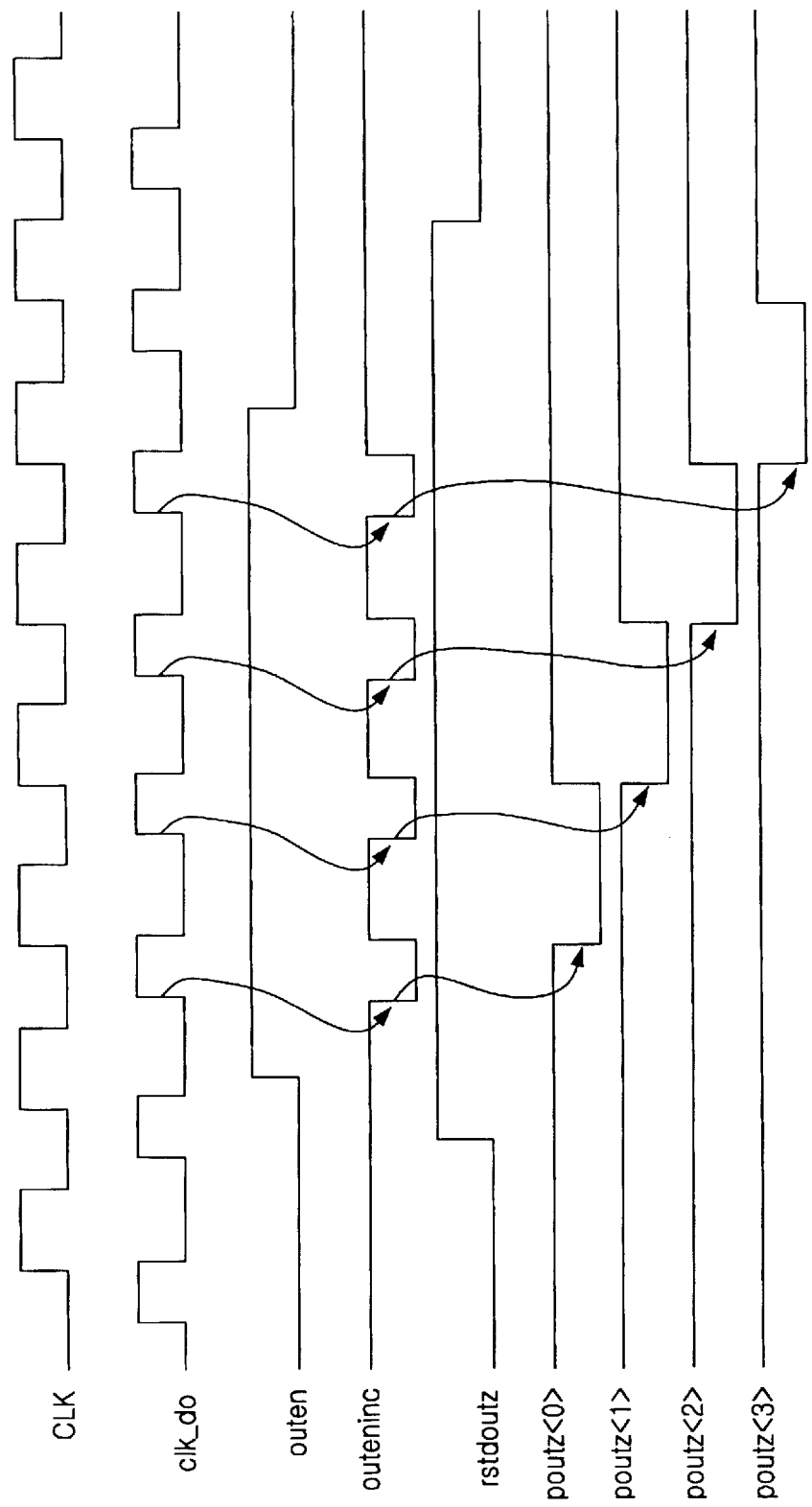
FIG. 3 is a timing chart of the pipe latch control circuit shown in FIG. 2 in accordance with the prior art.

The initial counting signal generator 40 is controlled by a reset signal rstdoutz and it is configured identically to the initial counting controller 20 of the pipe latch control circuit shown in FIG. 2.

Each counting stage includes a transfer gate controlled by an increment signal outeninc_new, an inverter latch and an ordinary counter. However, the increment signal outeninc_new, which controls the transfer gate of each counting stage, uses an inverting signal of a drive signal clk_do in a data output buffer and an output signal of the initial counting signal generator 40 uses the initial counting signal k<0> without any delay.

Also, the initial counting signal generator 40 is placed in first counting stage rather than in a fourth counting stage as in the prior art. However, it is simply the change for using the output signal of the initial counting signal generator 40 and the initial counting signal generator 40 is operated the same as any other counting stage.

A NAND latch unit 44 includes NAND latches 44A through 44D for latching counting signals k<0:3> of each counting stage. Each NAND latch 44A through 44D is made up of two NAND gates and two inverters. For each NAND latch, the counting signal outputted from each counting stage becomes one input and the data output buffer drive signal clk_do becomes the other input. That is, each NAND latch is controlled by the data output buffer drive signal clk_do and the relevant counting signal k<0:3>, which is outputted from the corresponding counting stage.

Figure 5:
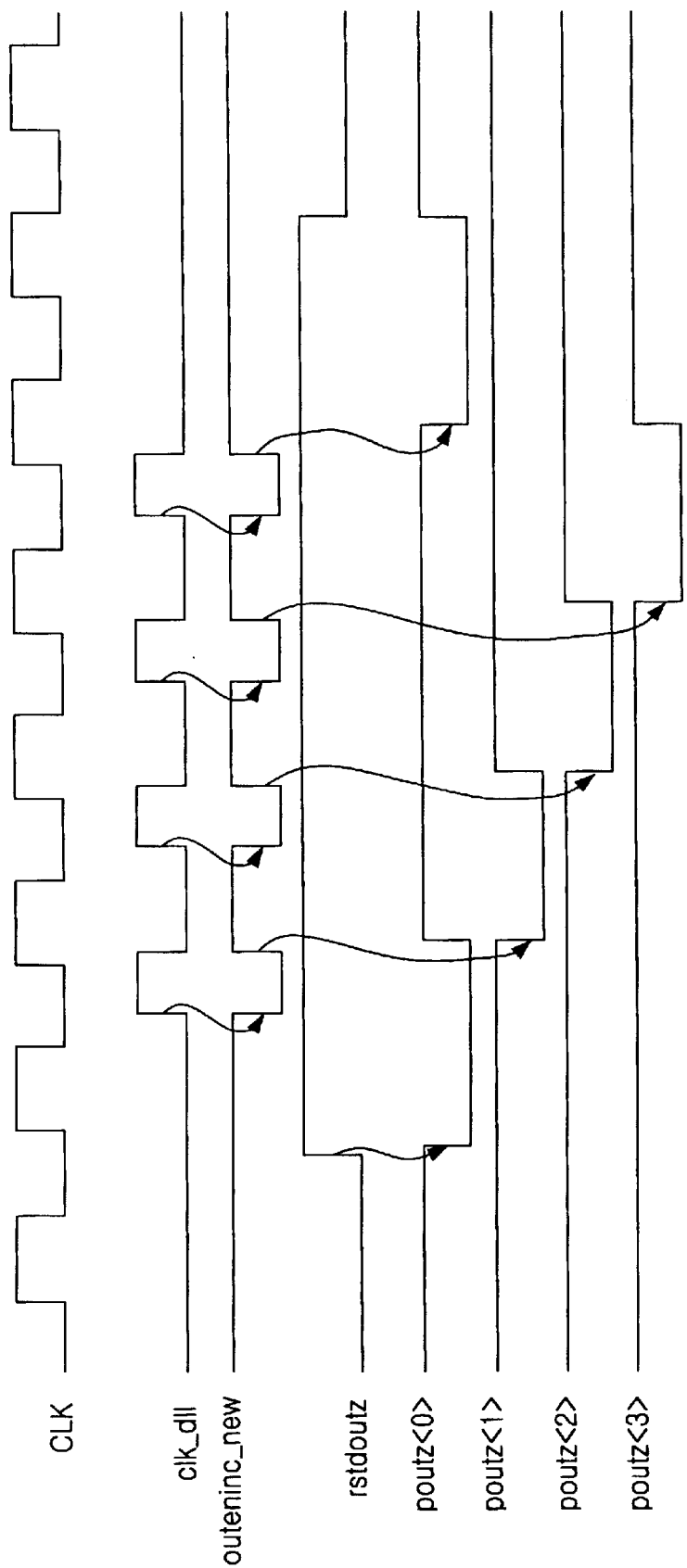
FIG. 5 is a timing chart of the pipe latch control circuit shown in FIG. 4.

FIG. 5 is a timing chart of the pipe latch control circuit shown in FIG. 4. In FIG. 5, let the burst length BL be 4 when using the SDRAM and the burst length BL is 8 in case of using the DDR SDRAM.

In the pipe latch control circuit of the present invention, a NAND operation is performed on the data output buffer drive signal clk_do to generate the increment signal outeninc_new. That is, the increment signal outeninc_new is generated by inverting the data output buffer drive signal clk_do rather than performing a NAND operation on the output enable signal outen and the DLL clock signal clk_dll as in the prior art.

First of all, once the reset signal rstdoutz is in logic 'high' and deactivated, the initial counting signal k<0> becomes logic 'high' in response to the reset signal rstdoutz and the initial pipe output control signal poutz<0> becomes logic 'low' because the data output buffer drive signal clk_do, which is in logic 'low', is inputted into the NAND latch unit 44.

Next, once the data output buffer drive signal clk_do becomes logic 'high', the data output buffer opens and the data is outputted to the data output terminal DQ. At the same time, the increment signal outeninc_new becomes logic 'low' and the pipe output control signal poutz<0> is maintained at the logic 'low' state. However, once the data output buffer drive signal clk_do becomes logic 'high', all the counters start the operation.

After that, the data output buffer is closed once the data output buffer drive signal clk_do is disabled to logic 'low'. The increment signal outeninc_new is disabled to logic 'high' in order to disable the initial pipe output control signal poutz<0> to logic 'high'. Also, the pipe output control signal poutz<1> is enabled by driving the counting signal k<1> in the next stage after latching from the NAND latch 44B.

In the present invention, the counter in each stage is incremented by receiving the data output buffer drive signal clk_do. That is, the counting signal is synchronized with the reset signal to generate the initial pipe output control signal poutz<0>. Once the data from the data output buffer is completely outputted to the data output terminal DQ by the data output buffer drive signal clk_do, the next pipe output control signal poutz<1> is enabled.

The possibility of the data output buffer drive signal clk_do deviating from the activated windows of the pipe output control signals poutz<0:3> is very low. This means, the loss of data access time TAA does not occur even in the worst conditions because the data output buffer drive signal clk_do passes through four gates to receive the data as soon as the data output buffer drive signal clk_do is disabled.

In the present invention, the numbers of counter stages and the logic configuration of the pipe latch control circuit can be changed.

According to the present invention, an erroneous operation of the memory device can be avoided by reducing the loss of data access time TAA and applying the operation frequency to the synchronous memory device.

While the present invention has been described with respect to the particular embodiments, it will be apparent to those skilled in the art that various changes and modifications may be made without departing from the spirit and scope of the invention as defined in the following claims.

What is claimed is:

1. An apparatus for a pipe latch control circuit controlled by a pipe output control signal in a synchronous memory device, comprising:
   a plurality of counting stages for counting in sequence in response to a data output buffer drive signal, said plurality of counting stages outputting a plurality of counting signals, respectively; and
   a counting signal drive means for generating the pipe output control signal by driving each counting signal outputted from the plurality of counting stages and controlled by the data output buffer drive signal, said counting signal drive means having a plurality of latch means, each of said latch means for receiving the data output buffer drive signal and a counting signal of said plurality of counting signals in order to reduce lost data access time.

2. The apparatus as recited in claim 1, wherein a first counting stage of the plurality of counting stages includes an initial counting signal generation means for generating an initial counting signal in response to a counting reset signal.

3. The apparatus as recited in claim 2, wherein said plurality of latch means latch latching each counting signal in response to the data output buffer drive signal.

4. The apparatus as recited in claim 3, wherein the counting signal drive means includes a plurality of drive means for driving an output of each latch means.

5. The apparatus as recited in claim 3, wherein the plurality of latch means includes a NAND latch having one input for the counting signal outputted from each counting stage and another input for the data output buffer drive signal.

6. The apparatus as recited in claim 4, wherein the plurality of drive means includes an inverter for inverting an output from each latch means.

7. The apparatus as recited in claim 3, wherein the pipe output control signal, corresponding to the initial counting signal, is synchronized with a disabled counting reset signal in order to enable the pipe output control signal.

8. The apparatus as recited in claim 3, wherein the plurality of counting stages is synchronized with the enabled data output buffer drive signal in order to enable the counting signal.

9. The apparatus as recited in claim 8, wherein the plurality of latch means is synchronized with each disabled data output buffer drive signal in order to output the latched counting signal.

10. An apparatus for a pipe latch control circuit controlled by a pipe output control signal in a synchronous memory device, comprising:

a plurality of counting stages for counting in sequence in response to a data output buffer drive signal; and a counting signal drive means for generating the pipe output control signal by driving each counting signal outputted from the plurality of counting stages and controlled by the data output buffer drive signal, said counting signal drive means including a plurality of latch means for latching each counting signal in response to the data output buffer drive signal, said latch means including a NAND latch having one input for the counting signal outputted from each counting stage and another input for the data output buffer drive signal.

11. The apparatus as recited in claim 10, wherein the counting signal drive means includes a plurality of drive means for driving an output of each latch means.

12. The apparatus as recited in claim 11, wherein the plurality of drive means includes an inverter for inverting an output from each latch means.

13. The apparatus as recited in claim 10, wherein a first counting stage of the plurality of counting stages includes an initial counting signal generation means for generating an initial counting signal in response to a counting reset signal.

14. The apparatus as recited in claim 13, wherein the pipe output control signal, corresponding to the initial counting signal, is synchronized with a disabled counting reset signal in order to enable the pipe output control signal.

15. The apparatus as recited in claim 10, wherein the plurality of counting stages is synchronized with the enabled data output buffer drive signal in order to enable the counting signal.

16. The apparatus as recited in claim 15, wherein the plurality of latch means is synchronized with each disabled data output buffer drive signal in order to output the latched counting signal.

\* \* \* \* \*